United States Patent
Kan

(10) Patent No.: US 6,496,036 B2
(45) Date of Patent: Dec. 17, 2002

(54) INPUT-OUTPUT BUFFER CIRCUIT

(75) Inventor: Yasuhiro Kan, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/801,761

(22) Filed: Mar. 9, 2001

(65) Prior Publication Data

US 2002/0057105 A1 May 16, 2002

(30) Foreign Application Priority Data

Nov. 10, 2000 (JP) .................................... 2000-344361

(51) Int. Cl.[7] ........................ H03K 19/00; H03K 19/02
(52) U.S. Cl. .............................. 326/58; 326/81; 326/86
(58) Field of Search .............................. 326/57, 58, 80, 326/81, 83, 86

(56) References Cited

U.S. PATENT DOCUMENTS

| 5,021,684 A | * | 6/1991 | Ahuja et al. ................. 307/443 |
| 5,146,563 A | * | 9/1992 | Donaldson et al. ......... 395/250 |
| 6,043,680 A | * | 3/2000 | Dasgupta ...................... 326/81 |
| 6,130,556 A | * | 10/2000 | Schmitt et al. ............... 326/81 |

FOREIGN PATENT DOCUMENTS

| JP | 4-243321 | 8/1992 |
| JP | 6-291638 | 10/1994 |
| JP | 7-99437 | 4/1995 |
| JP | 8-237102 | 9/1996 |

* cited by examiner

Primary Examiner—Daniel D. Chang
(74) Attorney, Agent, or Firm—Leydig, Voit & Mayer, Ltd.

(57) ABSTRACT

The input-output buffer circuit is provided with a PMOS transistor and an NMOS transistor which form an output driver which are ordinary MOS transistors instead of high breakdown voltage transistors. A resistor is inserted between drains of those MOS transistors and an external terminal. The resistance of this resistor is such that it generates a voltage drop as to cause a potential of drains of the PMOS transistor and the NMOS transistor not to exceed a voltage which can be safely applied to those MOS transistors and to become a potential which is at least a threshold level of an input buffer, when a current path extending from the external terminal to a power supply terminal through a parasitic diode of the PMOS transistor is formed.

3 Claims, 5 Drawing Sheets

US 6,496,036 B2

INPUT-OUTPUT BUFFER CIRCUIT

FIELD OF THE INVENTION

The present invention relates to an input-output buffer circuit effecting signal input-output control normally even when a signal having a voltage higher than a power supply voltage of the input-output buffer circuit is inputted from an external source.

BACKGROUND OF THE INVENTION

As the semiconductor fabrication process uses finer line widths, the power supply voltage for driving a semiconductor integrated circuit (hereafter simply referred to as IC) implemented as a single chip tends to become lower. On the other hand, a commercially available electronic device is constructed in many cases by mounting a plurality of ICs having different specifications on the same printed circuit board. In some cases, therefore, ICs driven with high voltages according to conventional specifications and ICs driven with low voltages according to current and future trends are present on the same electronic device. In this case, an IC is often supplied with an input signal having a voltage higher than a power supply voltage of the IC itself.

In general, an IC has an input-output buffer circuit for effecting the signal input-output control in a stage immediately preceding its output terminal. Signals inputted and outputted via the external terminal pass through the input-output buffer circuit. FIG. 5 is a circuit diagram showing a conventional input-output buffer circuit and its operation.

The IC 100 has an external terminal 17 connected to a signal line 9. In a stage immediately preceding the external terminal 17, the IC 100 has an input-output buffer circuit which includes a PMOS transistor MP and an NMOS transistor MN forming an output driver, an input buffer 16 for inputting a signal fed from the external terminal 17, a NAND gate 31, a NOR gate 32, and an inverter 33.

The PMOS transistor MP is connected at its source to a power supply terminal 12, and connected at its drain to the external terminal 17. The NMOS transistor MN is connected at its source to the ground, and connected at its drain to the external terminal 17.

The NOR gate 32 is supplied at its first input terminal with output data and supplied at its second input terminal with an output enable signal. An output terminal of the NOR gate 32 is connected to the NMOS transistor MN at its gate. The inverter 33 is supplied with the output enable signal and supplies its inverted output to a first input terminal of the NAND gate 31. A second input terminal of the NAND gate 31 is supplied with the output data. An output terminal of the NAND gate 31 is connected to the PMOS transistor MP at its gate.

Operation of the input-output buffer circuit will now be explained. First, in output mode, i.e. when the output enable signal has logic level "L" (low), output data of a logic level "H" turns on the PMOS transistor MP and turns off the NMOS transistor MN. At this time, therefore, a potential equivalent to a power supply voltage fed from the power supply terminal 12 is supplied to the output terminal 17. A signal of the logic level "H" is thus outputted.

On the other hand, output data of a logic level "L" turns off the PMOS transistor MP and turns on the NMOS transistor MN. Therefore, the external terminal 17 becomes equal to a ground potential, and a signal of a logic level "L" is outputted. In other words, when the output enable signal has a logic level "L", the signal of the logic level indicated by the output data is outputted from the external terminal 17 as it is via mutually connected drains of the PMOS transistor MP and the NMOS transistor MN.

On the other hand, in input mode, i.e. when the output enable signal is provided with a logic level "H" (high), both the PMOS transistor MP and the NMOS transistor MN turn off. In other words, the external terminal 17 assumes a high impedance state. Irrespective of the logic state of the output data, the signal outputted to the outside assumes an indefinite state. In this state, a signal inputted from the outside to the external terminal 17 is inputted to an input buffer 16 and processed as input data.

As illustrated, the external terminal 17 of the IC 100 is connected to an external terminal 51 of another IC 200 via the signal line 9. A signal outputted from an input-output buffer circuit 56 included in the IC 200 is inputted to the external terminal 17. The internal circuit of the IC 200 is driven with a voltage higher than the power supply voltage with which the internal circuit of the IC 100 is driven. In FIG. 5, a power supply voltage supplied from a power supply terminal 11 is higher than the power supply voltage from the power supply terminal 12. In some cases, therefore, a signal having a voltage higher than the drive power supply voltage of the IC 100, i.e., a signal having a voltage higher than the voltage fed from the power supply terminal 12 is inputted to the IC 100.

If the drive power supply voltage of the IC 200, i.e., a signal having a voltage supplied from the power supply terminal 11 is inputted to the external terminal 17, then a current flows to the power supply terminal 12 through a parasitic diode 15 of the PMOS transistor MP as illustrated. This current makes the power supply voltage supplied to various circuits in the IC 100 unstable, and causes false operation or destruction of the PMOS transistor MP.

In the conventional input-output buffer circuit, a power supply terminal 13 for supplying a voltage having the same potential as the drive power supply voltage of the IC 200 is provided in the IC 100. The voltage fed from the power supply terminal 13 is applied to the PMOS transistor MP at its back gate. As a result, the external terminal 17 becomes equal in potential to the back gate of the PMOS transistor MP. A current is prevented from flowing to the power supply terminal 12 through the parasitic diode 15.

In the conventional input-output buffer circuit, however, a voltage higher than the voltage applied to other transistors included in the internal circuit is applied to the drains of the PMOS transistor MP and the NMOS transistor MN which form the output driver. Therefore, it is necessary to select a transistor having a high breakdown voltage as each of the PMOS transistor MP and the NMOS transistor MN. Furthermore, with the advance of smaller scale processes, implementation itself of transistors having a high breakdown voltage also becomes difficult.

Furthermore, since the back gate potential of the PMOS transistor MP becomes higher than the potential of the source connected to the power supply terminal 12, the transistor capability of the PMOS transistor MP becomes lower. For achieving a drive capability equivalent to that of ordinary transistors, therefore, it is necessary to increase the transistor size. Furthermore, there is a problem that the IC 100 needs the power supply terminal 13 for supplying the high voltage apart from the power supply terminal 12 for supplying the drive power supply voltage of the internal circuit.

SUMMARY OF THE INVENTION

It is an object of the present invention to provide an input-output buffer circuit to which an input signal having a potential higher than the drive power supply voltage can be inputted without using high breakdown voltage transistors.

The above described problems are solved and the object is achieved by the following aspects of the present invention. The input-output buffer circuit according to one aspect of the present invention includes an input buffer; a PMOS transistor and an NMOS transistor for forming an output buffer, drains of the PMOS transistor and the NMOS transistor being connected together; an output switchover circuit for switching an output mode for outputting output data from an external terminal to outside over to an input mode for inputting input data from the external terminal to the input buffer, and vice versa, according to an output enable signal; and a resistor disposed on a current path between the drains of the PMOS transistor and the NMOS transistor and the external terminal, and when a signal having a potential higher than a power supply potential for driving the own input-output buffer circuit is inputted to the external terminal, and thereby a current path extending from the external terminal to a power supply terminal through a parasitic diode of the PMOS transistor is formed, the resistor conducts potential lowering from the potential of the external terminal so as to cause a potential of drains of the PMOS transistor and the NMOS transistor not to exceed a voltage which can be applied to the PMOS transistor and the NMOS transistor and to become a potential which is at least a threshold level of the input buffer.

According to the above-mentioned aspect of the present invention, a resistor is inserted between the drains of the PMOS transistor and the NMOS transistor which form the output driver and the external terminal. Accordingly, even if a signal having a potential higher than the power supply potential for driving the own input-output buffer circuit is inputted to the external terminal, the potential of the signal can be lowered by the potential drop caused by the resistor. It thus becomes possible to always apply a voltage less than a voltage which can be applied to those MOS transistors, to the drains of the PMOS transistor and the NMOS transistor.

Further, it is preferable that the input-output buffer circuit further includes a comparator circuit for comparing the potential of the external terminal with the power supply potential, and the output switchover circuit is supplied with a comparison result from the comparator circuit. When the comparison result indicates that the potential of the external terminal is higher than the power supply potential, the output switchover circuit turns on the NMOS transistor connected at its source to a ground terminal.

Accordingly, the NMOS transistor connected at its source to the ground is turned on when the comparator circuit has judged the potential of the external terminal to be higher than the power supply potential. As a result, a current can be led from the external terminal to the ground terminal through the resistor.

Further, it is preferable that the input-output buffer circuit further includes a comparator circuit for comparing the potential of the external terminal with the power supply potential; and a back gate potential switchover circuit for receiving a comparison result of the comparator circuit. When the comparison result indicates that the potential of the external terminal is higher than the power supply potential, the back gate potential switchover circuit causes a back gate potential of the PMOS transistor to coincide with a ground potential, whereas when the comparison result indicates that the potential of the external terminal is equal to or less than the power supply potential, the back gate potential switchover circuit causes the back gate potential of the PMOS transistor to coincide with the power supply potential.

Accordingly, the back gate potential of the PMOS transistor is made to coincide with the ground potential when the comparator circuit has judged the potential of the external terminal to be higher than the power supply potential. In that case, therefore, a current can be led from the external terminal to the ground terminal through the resistor, the parasitic PNP transistor of the PMOS transistor, and the well resistor of the PMOS transistor.

Further, it is preferable that the input-output buffer circuit further includes a current control circuit responsive to the potential of the external terminal being higher than the power supply potential, for controlling a potential lowered by using the resistor so as to cause the potential lowered by using the resistor to become equal to the power supply potential.

Accordingly, the current control circuit controls the potential of a first end of the resistor so as to cause it to coincide with the power supply potential, when the current control circuit has judged the potential of the first end of the resistor to be higher than the power supply potential. It thus becomes possible to always apply a voltage less than a voltage which can be applied to those MOS transistors, to the drains of the PMOS transistor and the NMOS transistor.

Other objects and features of this invention will become apparent from the following description with reference to the accompanying drawings.

DESCRIPTION OF THE PREFERRED EMBODIMENTS

Figure 1:
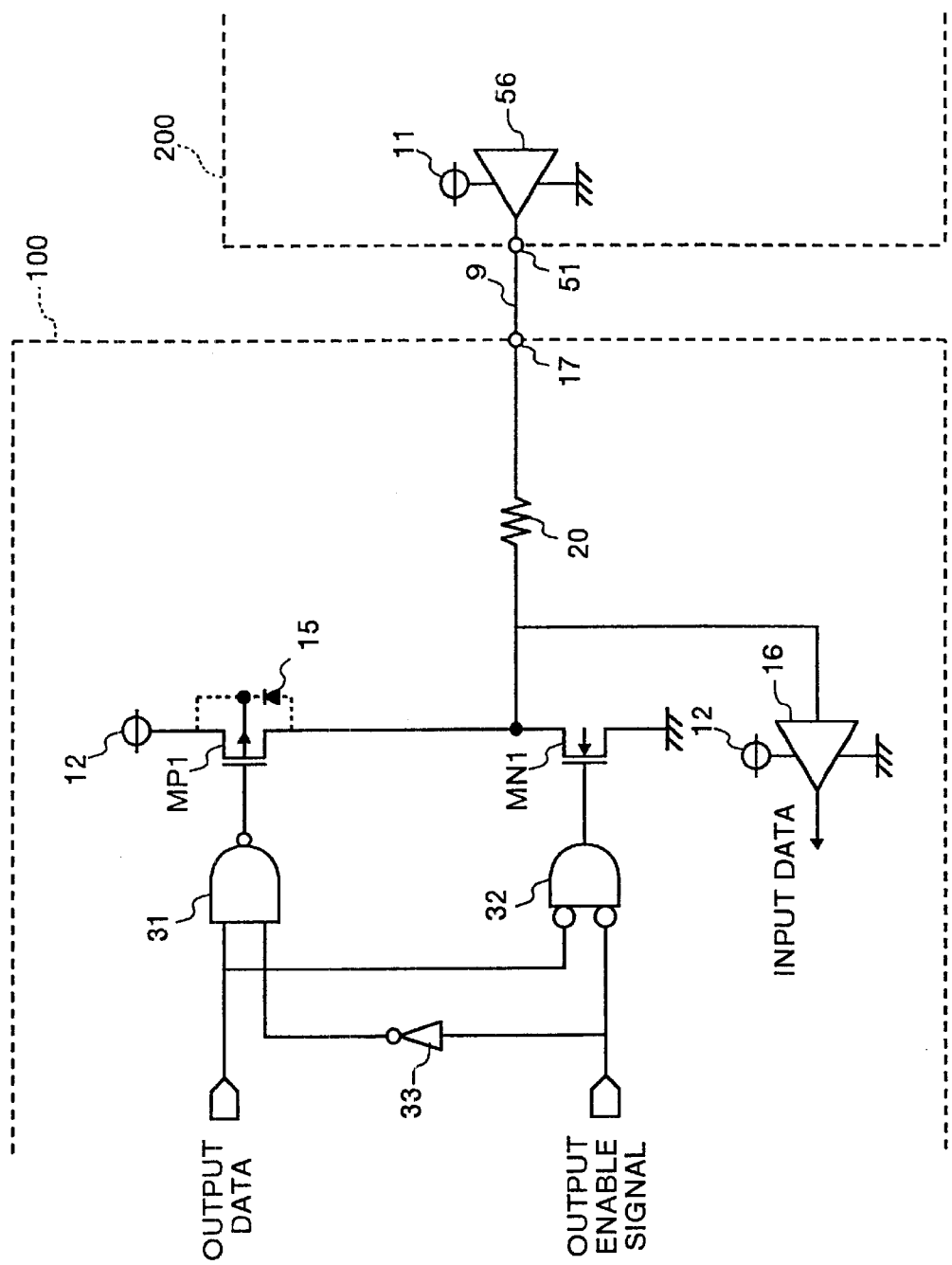
FIG. 1 is a circuit diagram showing an input-output buffer circuit according to a first embodiment of the present invention.

Preferred embodiments of the input-output buffer circuit according to the present invention will be described below in detail by referring to the drawing. The present invention is not restricted by the embodiments.

The input-output buffer circuit according to a first embodiment of the present invention will now be described. FIG. 1 is a circuit diagram showing an input-output buffer circuit according to the first embodiment of the present invention and its operation. In FIG. 1, components common to those of FIG. 5 are denoted by like legends and description thereof will be omitted.

Figure 5:
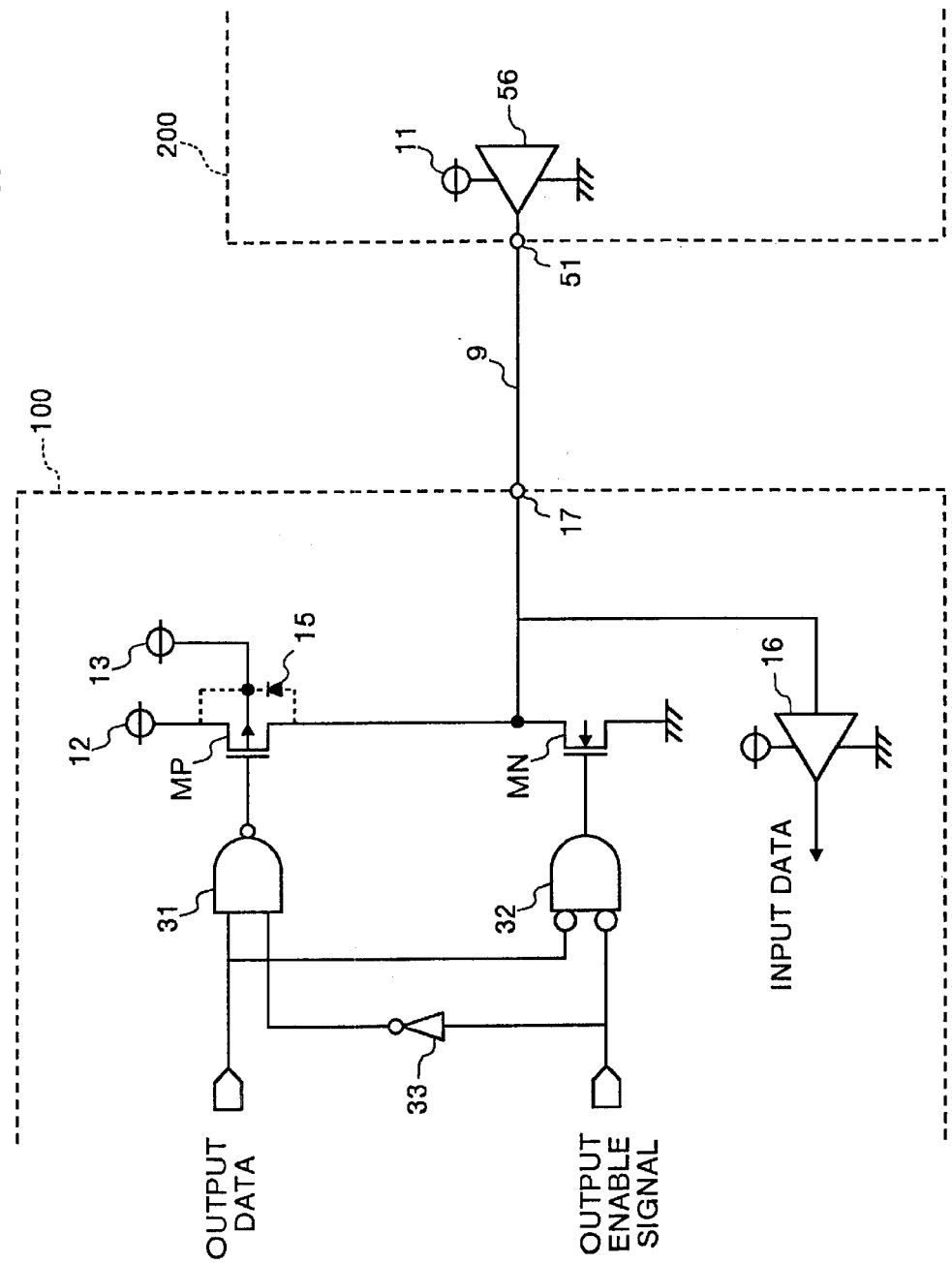
FIG. 5 is a circuit diagram showing a conventional input-output buffer circuit.

An input-output buffer circuit of an IC 100 of FIG. 1 differs from that of FIG. 5 in that the PMOS transistor MP and the NMOS transistor MN are replaced by an ordinary PMOS transistor MP1 and an ordinary NMOS transistor MN1 which are not high breakdown voltage transistors, and a resistor 20 is inserted between a node of drains of the PMOS transistor MP1 and the NMOS transistor MN1 and the external terminal 17. The back gate of the PMOS transistor MP1 is connected to its source. The back gate of the PMOS transistor MP1 has the same potential as that of the power supply terminal 12.

The input-output buffer circuit according to the first embodiment operates as follows. Operation in the output mode is the same as that of FIG. 5 and description thereof will be omitted. Therefore, operation in the input mode will now be described. In response to the output enable signal which has changed to the logic level "H", the input-output buffer circuit is set to the output mode and both the PMOS transistor MP1 and the NMOS transistor MN1 assume off states.

In this state, an input signal from the IC 200 is inputted to the external terminal 17. The drive power supply voltage of the IC 200, i.e., the power supply voltage supplied from the power supply terminal 11 in FIG. 1 is higher than the drive power supply voltage of the IC 100, i.e., the power supply voltage supplied from the power supply terminal 12 in FIG. 1. At this time, therefore, the potential of the external terminal 17 becomes higher than the source potential of the PMOS transistor MP1. In other words, there is formed a current path from the external terminal 17 to the power supply terminal 12 through the parasitic diode 15 of the PMOS transistor MP1.

Due to the existence of the resistor 20 inserted in the current path, however, the drain potential of the PMOS transistor MP1 and the NMOS transistor MN1 which form the output driver is lowered. The magnitude of the voltage drop depends on the resistance value of the resistor 20. By providing the resistor 20 with such a resistance value that the drain potential of the PMOS transistor MP1 coincides with the potential of the power supply terminal 12, therefore, the current flowing from the drain of the PMOS transistor MP1 to the power supply terminal 12 through the parasitic diode 15 can be prevented from occurring. It thus becomes possible to prevent the drain potential of the PMOS transistor MP1 and the NMOS transistor MN1 from exceeding the voltage which can be applied.

The resistor 20 may have such a resistance value that a slight current flows from the drain of the PMOS transistor MP1 to the power supply terminal 12 through the parasitic diode 15 but the drain potential of the PMOS transistor MP1 and the NMOS transistor MN1 satisfies the following relation: (upper limit of voltage which can be applied to the PMOS transistor MP1 and the NMOS transistor MN1)>(drain potential)>(threshold potential of the input buffer 16).

As heretofore described, in the input-output buffer circuit according to the first embodiment, the PMOS transistor MP1 and the NMOS transistor MN1 which form the output driver are determined to be ordinary MOS transistors instead of high breakdown voltage transistors, and the resistor 20 is inserted between the drains of those MOS transistors and the external terminal 17. Therefore, it becomes possible to process the input signal of a voltage higher than the own power supply voltage by using the output driver formed of ordinary MOS transistors. In addition, it becomes possible to lower the potential of the input signal inputted to the external terminal 17 by the potential drop caused across the resistor 20. As a result, the drains of the PMOS transistor MP1 and the NMOS transistor MN1 are prevented from being supplied with a voltage exceeding the upper limit of the voltage which can be applied.

In the description of FIG. 1, the resistor 20 is provided within the IC 100. Even if a discrete resistor is disposed on the signal line 9 between the IC 100 and the IC 200, the same effect can be obtained.

The input-output buffer circuit according to a second embodiment of the present invention will now be described.

Figure 2:
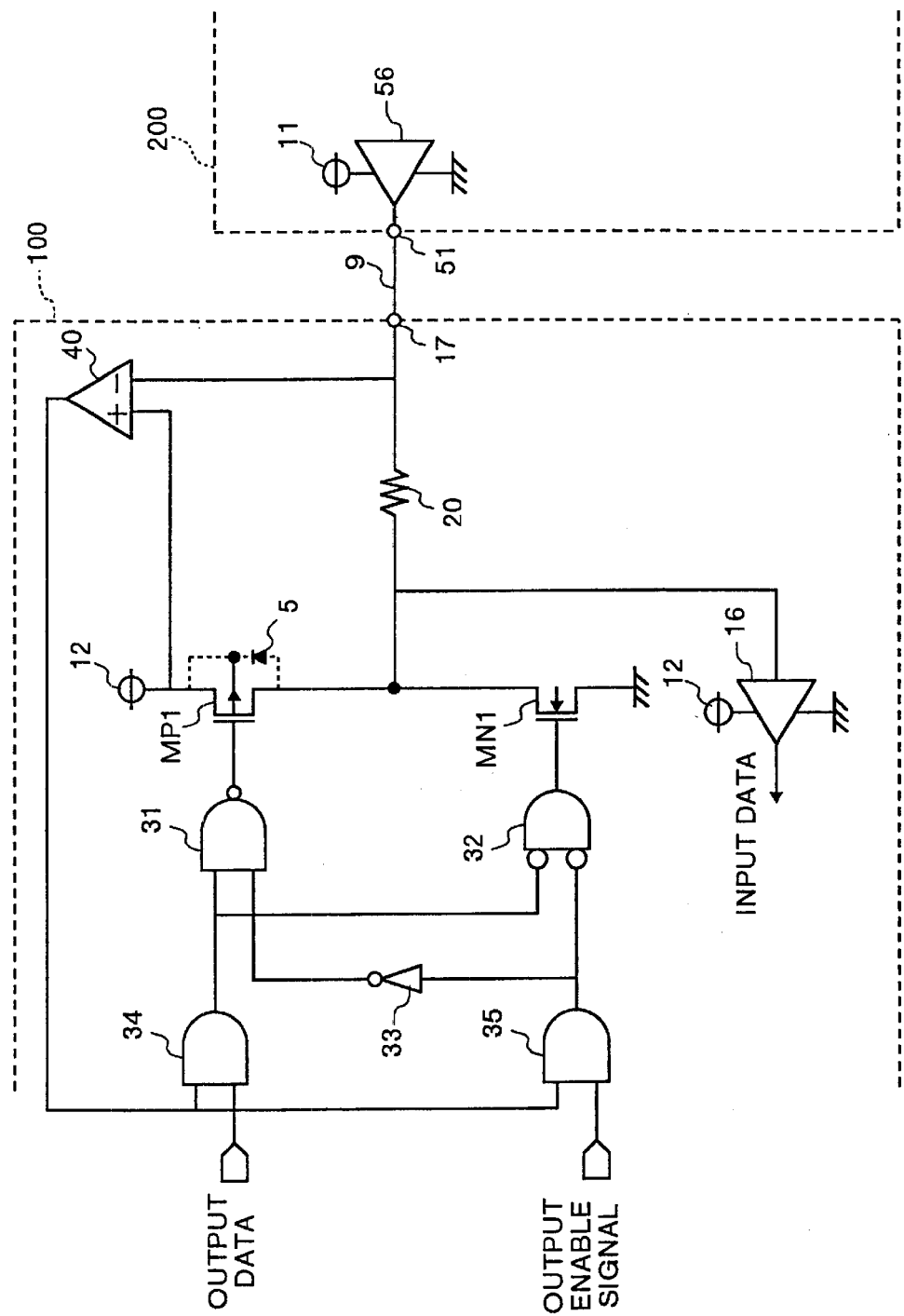
FIG. 2 is a circuit diagram showing an input-output buffer circuit according to a second embodiment of the present invention.

FIG. 2 is a circuit diagram showing an input-output buffer circuit according to the second embodiment of the present invention and its operation. In FIG. 2, components common to those of FIG. 1 are denoted by like legends and description thereof will be omitted.

In addition to the configuration shown in FIG. 1, the input-output buffer circuit of the IC 100 shown in FIG. 2 includes a comparator circuit 40 and AND gates 34 and 35. The comparator circuit 40 is a circuit for comparing the potential of the power supply terminal 12 which is the drive power supply voltage of the IC 100 with the potential of the external terminal 17. When the potential of the external terminal 17 is higher than the potential of the power supply terminal 12, the comparator circuit 40 outputs a signal of the logic level "L". When the potential of the external terminal 17 is lower than or equal to the potential of the power supply terminal 12, the comparator circuit 40 outputs a signal of the logic level "H".

A first input terminal of the AND gate 34 is supplied with a signal indicating a result of the comparison conducted in the comparator circuit 40. A second input terminal of the AND gate 34 is supplied with the output data. The NAND gate 31 is supplied with an output signal of the AND gate 34 instead of the output data.

A first input terminal of the AND gate 35 is supplied with the signal indicating the result of the comparison conducted in the comparator circuit 40. A second input terminal of the AND gate 35 is supplied with the output enable signal. The NOR gate 32 and the inverter 33 are supplied with an output signal of the AND gate 35 instead of the output enable signal.

The input-output buffer circuit according to the second embodiment operates as follows. Operation in the output mode is the same as that described by referring to FIG. 5, and hence description thereof will be omitted. Operation in the input mode will now be described. When the potential of the external terminal 17 is lower than or equal to the potential of the power supply terminal 12, a signal of the logic level "H" is supplied to the first input terminals of the AND gates 34 and 35.

In this case, therefore, the AND gates 34 and 35 convey the signals of logic levels indicated by the output data and the output enable signal to the NAND gate 31, and the NOR gate 32 and the inverter 33, respectively. In other words, the PMOS transistor MP1 and the NMOS transistor MN1 forming the output driver are driven in the same way as the conventional input-output buffer circuit and the input-output buffer circuit shown in FIG. 1.

On the other hand, when the potential of the external terminal 17 is higher than the potential of the power supply terminal 12, a signal of the logic level "L" is supplied to the first input terminals of the AND gates 34 and 35.

Irrespective of the logic level of the signal supplied to the second input terminal, therefore, each of the AND gates 34 and 35 outputs a signal of the logic level "L". As a result, both the NAND gate 31 and the NOR gate 32 output the signal of the logic level "H". Thus, the PMOS transistor MP1 assumes the off t-state and the NMOS transistor MN1 assumes the on-state.

A current path is thus formed from the external terminal 17 to the ground terminal through the resistor 20 and the NMOS transistor MN1. In the same way the first embodiment, the drain potential of the PMOS transistor MP1 and the NMOS transistor MN1 is lowered by the resistor 20. In this case as well, the resistor 20 is provided with such a resistance value that the drain potential of the PMOS transistor MP1 coincides with the potential of the power supply terminal 12. It is thus possible to prevent the drain potential of the PMOS transistor MP1 and the NMOS transistor MN1 from exceeding the voltage which can be applied.

The resistor 20 may have such a resistance value that the drain potential of the PMOS transistor MP1 and the NMOS transistor MN1 satisfy the following relation: (upper limit of voltage which can be applied to PMOS transistor MP1 and the NMOS transistor MN1)>(drain potential)>(threshold potential of input buffer 16).

As heretofore described, the input-output buffer circuit according to the second embodiment includes in addition to the configuration of the input-output buffer circuit according to the first embodiment, the comparator circuit 40 for comparing the potential of the external terminal 17 with the potential of the power supply terminal 12, the AND gate 34 for conveying the logical product of the comparison result of the comparator circuit 40 and the output data to the NAND gate 31, and the AND gate 35 for conveying the logical product of the comparison result of the comparator circuit 40 and the output enable signal to the NOR gate 32. When the potential of the external terminal 17 is higher than the potential of the power supply terminal 12, the NMOS transistor MN1 is driven to the on-state. In addition to the effect of the voltage drop across the resistor 20, therefore, the current which flows from the external terminal 17 through the resistor 20 can be led to the ground terminal. Especially in the second embodiment, the influence exerted upon the rest of the internal circuit can be decreased as compared with the case where the current flowing through the resistor 20 is led to the power supply terminal 12 as in the in put-output buffer circuit according the first embodiment.

Figure 3:
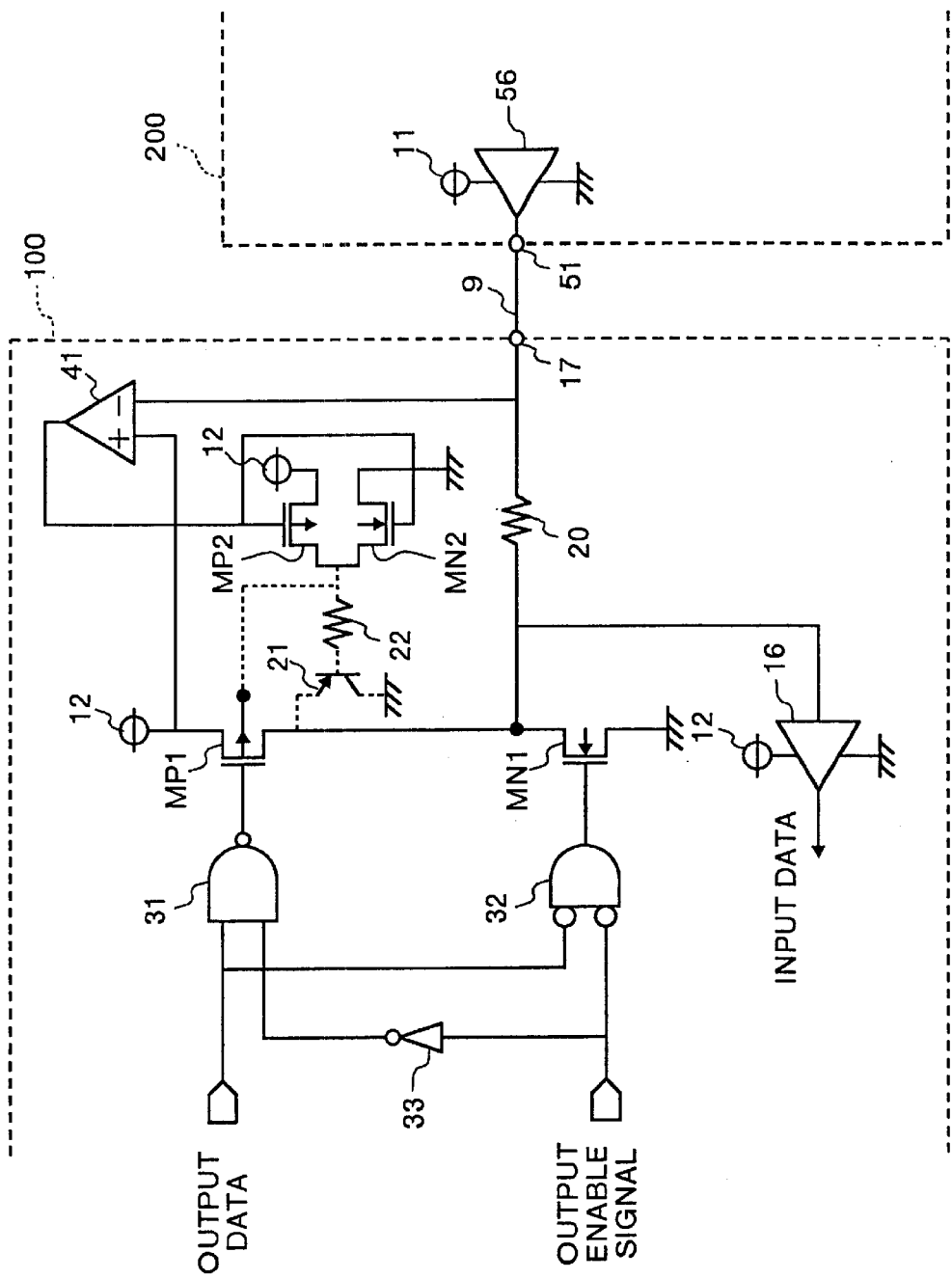
FIG. 3 is a circuit diagram showing an input-output buffer circuit according to a third embodiment of the present invention.

The input-output buffer circuit according to a third embodiment of the present invention will now be described. FIG. 3 is a circuit diagram showing an input-output buffer circuit according to the third embodiment of the present invention and its operation. In FIG. 3, components common to those of FIG. 1 are denoted by like legends and description thereof will be omitted. However, the back gate of the PMOS transistor MP1 is not connected directly to the source thereof.

In addition to the configuration shown in FIG. 1, the input-output buffer circuit of the IC 100 show n in FIG. 3 includes a comparator circuit 41, a PMOS transistor MP2 and an NMOS transistor MN2. The comparator circuit 41 is a circuit for comparing the potential of the power supply terminal 12 which is the drive power supply voltage of the IC 100 with the potential of the external terminal 17. When the potential of the external terminal 17 is higher than the potential of the power supply terminal 12, the comparator circuit 41 outputs a signal of the logic level "H". When the potential of the external terminal 17 is lower than or equal to the potential of the power supply terminal 12, the comparator circuit 41 outputs a signal of the logic level "L".

The PMOS transistor MP2 is connected at its source to the power supply terminal 12, and supplied at its gate with an output signal of the comparator circuit 41. The NMOS transistor MN2 is connected at its source to the ground, and supplied at its gate with the output signal of the comparator circuit 40. Drains of the PMOS transistor MP2 and the NMOS transistor MN2 are connected together.

Furthermore, in FIG. 3, a parasitic PNP transistor 21 of the PMOS transistor MP1 and a well resistor 22 connected to the parasitic PNP transistor 21 at its gate are shown. The back gate or well of the PMOS transistor MP1 is connected to the drains of the PMOS transistor MP2 and the NMOS transistor MN2. Therefore, the back gate potential of the PMOS transistor MP1 is varied according to the on/off state of the PMOS transistor MP2 and the NMOS transistor MN2, i.e., the output signal of the comparator circuit 41.

The input-output buffer circuit according to the third embodiment operates as follows. Operation in the output mode is the same as that described by referring to FIG. 5, and hence description thereof will be omitted. Operation in the input mode will now be described. When the potential of the external terminal 17 is lower than or equal to the potential of the power supply terminal 12, a signal of the logic level "L" is supplied to the gates of the PMOS transistor MP2 and the NMOS transistor MN2.

As a result, the PMOS transistor MP2 assumes the on-state and the NMOS transistor MN2 assumes the off-state. In other words, the back gate potential of the PMOS transistor MP1 becomes equal in potential to the power supply terminal 12, and the entire input-output buffer circuit functions in the same way as the input-output buffer circuit shown in FIG. 1.

On the other hand, when the potential of the external terminal 17 is higher than the potential of the power supply terminal 12, a signal of the logic level "H" is supplied to the gates of the PMOS transistor MP2 and the NMOS transistor MN2. As a result, the PMOS transistor MP2 assumes the off-state and the NMOS transistor MN2 assumes the on-state. In other words, the back gate of the PMOS transistor MP1 is connected to the ground via the NMOS transistor MN2.

Furthermore, in this state, the parasitic PNP transistor 21 is connected at its base as well to the ground. Accordingly, a voltage is applied between the emitter and base of the parasitic PNP transistor 21, and a base current flows. The base current becomes a current for forming a current path extending from the external terminal 17 to the ground terminal through the resistor 20, the parasitic PNP transistor 21, the well resistor 22, and the NMOS transistor MN2.

The current flowing out from the external terminal 17 generates a collector current of the parasitic PNP transistor 21 as well. In other words, the current flowing through the resistor 20 is divided into the collector current and the base current of the parasitic PNP transistor 21, when the current flowing through the resistor 20 is inputted to the parasitic PNP transistor 21. Both the collector current and the base current flow into the ground terminal.

In this case as well, the resistor 20 is provided with such a resistance value that the drain potential of the PMOS transistor MP1 coincides with the potential of the power supply terminal 12. It is thus possible to prevent the drain potential of the PMOS transistor MP1 and the NMOS transistor MN1 from exceeding the voltage which can be applied.

The resistor 20 may have such a resistance value that the drain potential of the PMOS transistor MP1 and the NMOS transistor MN1 satisfy the following relation: (upper limit of voltage which can be applied to PMOS transistor MP1 and the NMOS transistor MN1)>(drain potential)>(threshold potential of input buffer 16).

As heretofore described, the input-output buffer circuit according to the third embodiment includes in addition to the configuration of the input-output buffer circuit according to the first embodiment, the comparator circuit 40 for comparing the potential of the external terminal 17 with the potential of the power supply terminal 12, and the PMOS transistor MP2 and the NMOS transistor MN2 for controlling the back gate potential of the PMOS transistor MP1 according to the result of comparison conducted in the comparator circuit 40. When the potential of the external terminal 17 is higher than the potential of the power supply terminal 12, the back gate of the PMOS transistor MP1 is connected in potential to the ground, and the current path including the parasitic PNP transistor 21 and the well resistor 22 is formed at the drain of the PMOS transistor MP1. In addition to the effect of the voltage drop across the resistor 20, therefore, the current which flows from the external terminal 17 through the resistor 20 can be led to the ground terminal.

Especially in the third embodiment, the influence exerted upon the rest of the internal circuit can be decreased as compared with the case where the current flowing through the resistor 20 is led to the power supply terminal 12 as in the input-output buffer circuit according the first embodiment. In addition, since the AND gates 34 and 35 are not required unlike the second embodiment, the speed of processing of inputting the input signal to the input buffer 16 can be increased.

An input-output buffer circuit according to a fourth embodiment of the present invention will now be described.

Figure 4:
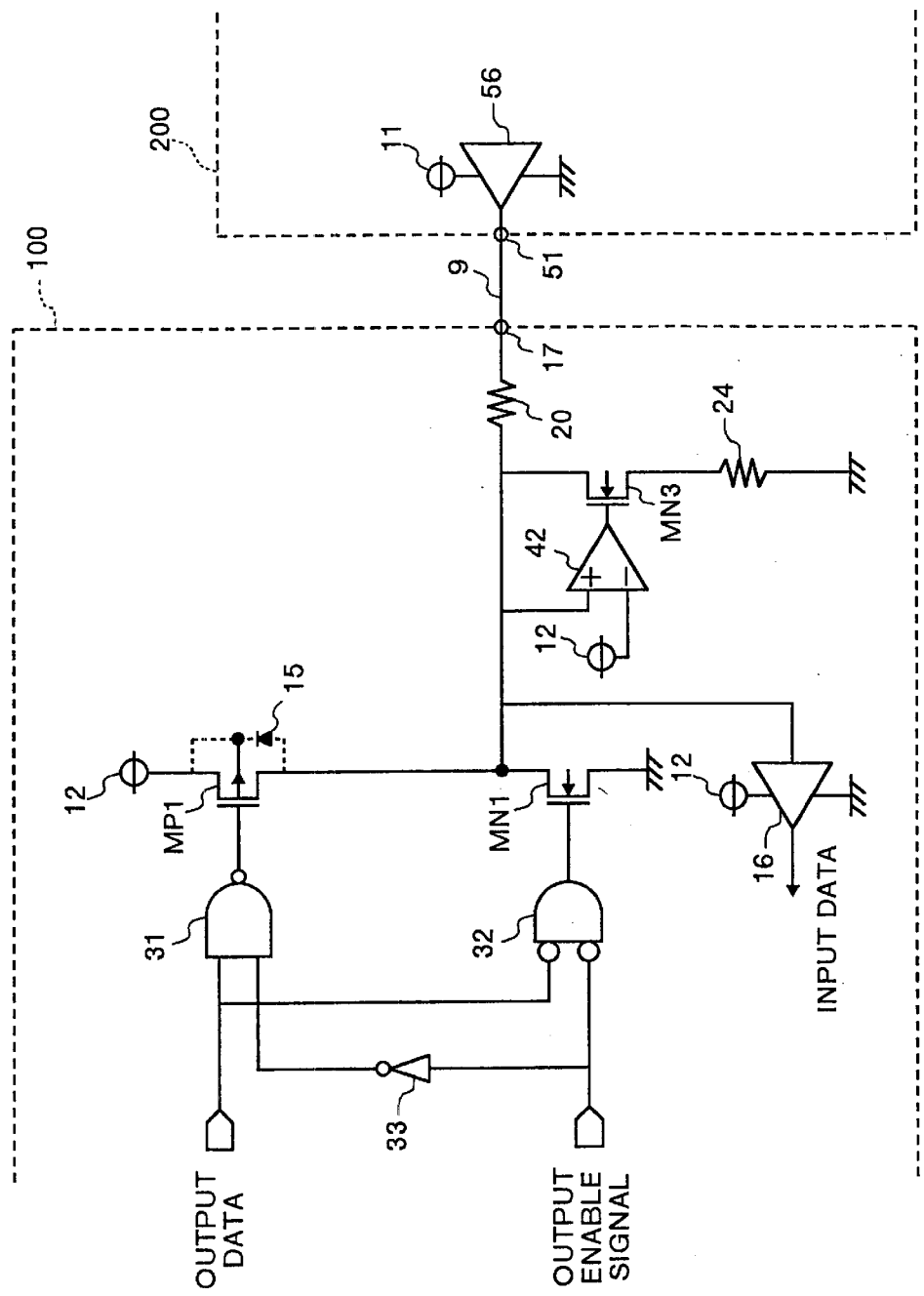
FIG. 4 is a circuit diagram showing an input-output buffer circuit according to a fourth embodiment of the present invention.

FIG. 4 is a circuit diagram showing an input-output buffer circuit according to the fourth embodiment of the present invention and its operation. In FIG. 4, components common to those of FIG. 1 are denoted by like legends and description thereof will be omitted.

In addition to the configuration shown in FIG. 1, the input-output buffer circuit of the IC 100 shown in FIG. 4 includes a comparator circuit 42, an NMOS transistor MN3, and a resistor 24. The comparator circuit 42 is a circuit for comparing the potential of the power supply terminal 12 which is the drive power supply voltage of the IC 100 with a potential of a first end of the resistor 20 located 20 opposite to the external terminal 17. When the potential of the first end of the resistor 20 is higher than the potential of the power supply terminal 12, the comparator circuit 42 outputs a signal having a level which is at least a threshold level of the NMOS transistor MN3. When the potential of the external terminal 17 is lower than or equal to the potential of the power supply terminal 12, the comparator circuit 42 outputs a signal having a level lower than the threshold level of the NMOS transistor MN3.

The NMOS transistor MN3 is connected at its drain to the first end of the resistor 20, connected at its source to a first terminal of the resistor 24, and coupled at its gate to the output signal of the comparator circuit 42. A second terminal of the resistor 24 is connected to the ground.

The input-output buffer circuit according to the fourth embodiment operates as follows. Operation in the output mode is the same as that described by referring to FIG. 5, and hence description thereof will be omitted. Operation in the input mode will now be described. When the potential of first end of the resistor 20 is lower than or equal to the potential of the power supply terminal 12, a signal having a level lower than the threshold level is supplied to the gate of the NMOS transistor MN3. Accordingly, the NMOS transistor MN3 assumes the off-state. The drains of the PMOS transistor MP1 and the NMOS transistor MN1 thus become the same potential as the potential of the first end of the resistor 20. As a result, the entire input-output buffer circuit functions in the same way as the input-output buffer circuit shown in FIG. 1.

On the other hand, when the potential of the first potential of the resistor 20 is higher than the potential of the power supply terminal 12, a signal having a level which is at least the threshold level is inputted to the gate of the NMOS transistor MN3. Thus, the NMOS transistor MN3 assumes the on-state. As a result, a current path extending from the first end of the resistor 20 to the ground terminal through the NMOS transistor MN3 and the resistor 24 is formed. The first end of the resistor 20 has a potential equivalent to the sum of a voltage drop value between the source and drain of the NMOS transistor MN3 and a voltage drop value across the resistor 24.

The comparator circuit 42 outputs a signal which is at least the threshold level with such a magnitude that the potential of the first end of the resistor 20 coincides with the potential of the power supply terminal 12. In other words, when the potential of the first end of the resistor 20 is higher than the potential of the power supply terminal 12, the comparator circuit 42 actively controls the drain potential of the PMOS transistor MP1 and the NMOS transistor MN1 so as to make it coincide with the potential of the power supply terminal 12. By the way, the resistor 24 is set to an appropriate resistance value by taking the resistor 20 into consideration.

As heretofore described, the input-output buffer circuit according to the fourth embodiment includes in addition to the configuration of the input-output buffer circuit according to the first embodiment, the comparator circuit 42 for comparing the potential of the first end of the resistor 20 with the potential of the power supply terminal 12, the NMOS transistor MN3 for controlling the drain potential of the PMOS transistor MP1 and the NMOS transistor MN1 according to the result of comparison conducted in the comparator circuit 42, and the resistor 24. When the potential of the first end of the resistor 20 is higher than the potential of the power supply terminal 12, the drain potential of the PMOS transistor MP1 and the NMOS transistor MN1 is made to coincide with the potential of the power supply terminal 12. As a result, it becomes possible to prevent such a voltage as to exceed the upper limit of the voltage which can be applied from being applied to the drains of the PMOS transistor MP1 and the NMOS transistor MN1.

In the input-output buffer circuit according to the first to third embodiments, it is necessary to set the resistance value of the resistor 20 with due regard to the dispersion of the process and the dispersion of the power supply voltage. In the fourth embodiment, however, the setting is not necessary because the comparator circuit 42 automatically controls the drain potential of the PMOS transistor MP1 and the NMOS transistor MN1.

According to one aspect of the present invention, the resistor is inserted between the drains of the PMOS transistor and the NMOS transistor which form the output driver and the external terminal. Even if a signal having a potential higher than the power supply potential for driving the own input-output buffer circuit is inputted to the external terminal, therefore, the potential of the signal can be lowered by the potential drop caused by the resistor. It thus becomes possible to always apply a voltage less than a voltage which can be applied to those MOS transistors, to the drains of the PMOS transistor and the NMOS transistor. Thus, there is brought about an effect that it becomes possible to form an output driver by using ordinary MOS transistors which are not high breakdown voltage transistors and handle an input signal having a potential higher than the own power supply voltage.

Furthermore, the NMOS transistor connected at its source to the ground is turned on when the comparator circuit has judged the potential of the external terminal to be higher than the power supply potential. As a result, a current can be led from the external terminal to the ground terminal through the resistor. Thus, there is brought about an effect that the influence on the rest of the internal circuit can be reduced as compared with the case where the current flowing through the resistor is led to the power supply terminal.

Furthermore, the back gate potential of the PMOS transistor is made to coincide with the ground potential when the comparator circuit has judged the potential of the external terminal to be higher than the power supply potential. In that case, therefore, a current can be led from the external terminal to the ground terminal through the resistor, the parasitic PNP transistor of the PMOS transistor, and the well resistor of the PMOS transistor. Thus, there is brought about an effect that the influence on the rest of the internal circuit can be reduced as compared with the case where the current flowing through the resistor is led to the power supply terminal.

Furthermore, the current control circuit controls the potential of a first end of the resistor so as to cause it to coincide with the power supply potential, when the current control circuit has judged the potential of the first end of the resistor to be higher than the power supply potential. It thus becomes possible to always apply a voltage less than a voltage which can be applied to those MOS transistors, to the drains of the PMOS transistor and the NMOS transistor. Thus, there is brought about an effect that it becomes unnecessary to set the resistance value of the resistor by taking the dispersion of the process and the dispersion of the power supply voltage into consideration.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An input-output buffer circuit comprising:

an external terminal;

an input buffer connected to said external terminal;

an output buffer including a PMOS transistor and an NMOS transistor, wherein drain terminals of said PMOS transistor and said NMOS transistor are connected together;

an output switch circuit which switches between an output mode for outputting output data from said output buffer at said external terminal, and an input mode for receiving input data from said external terminal at said input buffer in response to an output enable signal;

a resistor connected at one end to said drain terminal of said PMOS transistor and said drain terminal of said NMOS transistor, and connected at the other end to said external terminal, wherein, when a signal having a potential higher than a power supply potential for driving said input-output buffer circuit is input to said external terminal, a current path extending from said external terminal to a power supply terminal through a parasitic diode of said PMOS transistor is formed, said resistor conducts, thereby lowering potential of said external terminal so that a resulting potential of the drain terminals of said PMOS transistor and said NMOS transistor does not exceed a voltage which would damage said PMOS transistor and said NMOS transistor, and the resulting potential is at least a threshold level of said input buffer; and a comparator circuit which compares the potential of said external terminal with the power supply potential, wherein said output switch circuit is supplied with a comparison result from said comparator circuit, and, when the comparison result indicates that the potential of said external terminal is higher than the power supply potential, said output switch circuit turns on said NMOS transistor, said NMOS transistor having a source terminal connected to ground.

2. An input-output buffer circuit comprising:

an external terminal;

an input buffer connected to said external terminal;

an output buffer including a PMOS transistor and an NMOS transistor, wherein drain terminals of said PMOS transistor and said NMOS transistor are connected together;

an output switch circuit which switches between an output mode for outputting output data from said output buffer at said external terminal, and an input mode for receiving input data from said external terminal at said input buffer in response to an output enable signal;

a resistor connected at one end to said drain terminal of said PMOS transistor and said drain terminal of said NMOS transistor, and connected at the other end to said external terminal, wherein, when a signal having a potential higher than a power supply potential for driving said input-output buffer circuit is input to said external terminal, a current path extending from said external terminal to a power supply terminal through a parasitic diode of said PMOS transistor is formed, said resistor conducts, thereby lowering potential of said external terminal so that a resulting potential of the drain terminals of said PMOS transistor and said NMOS transistor does not exceed a voltage which would damage said PMOS transistor and said NMOS transistor, and the resulting potential is at least a threshold level of said input buffer; and a comparator circuit which compares the potential of said external terminal with the power supply potential; and a back gate potential switch circuit for receiving a comparison result of said comparator circuit, wherein when the comparison result indicates that the potential of said external terminal is higher than the power supply potential, said back gate potential switch circuit causes a back gate potential of said PMOS transistor to coincide with ground potential, and when the comparison result indicates that the potential of said external terminal is not higher than the power supply potential, said back gate potential switch circuit causes the back gate potential of said PMOS transistor to coincide with the power supply potential.

3. An input-output buffer circuit comprising:

an external terminal;

an input buffer connected to said external terminal;

an output buffer including a PMOS transistor and an NMOS transistor, wherein drain terminals of said PMOS transistor and said NMOS transistor are connected together;

an output switch circuit which switches between an output mode for outputting output data from said output buffer at said external terminal, and an input mode for receiving input data from said external terminal at said input buffer in response to an output enable signal;

a resistor connected at one end to said drain terminal of said PMOS transistor and said drain terminal of said NMOS transistor, and connected at the other end to said external terminal, wherein, when a signal having a potential higher than a power supply potential for driving said input-output buffer circuit is input to said external terminal, a current path extending from said external terminal to a power supply terminal through a parasitic diode of said PMOS transistor is formed, said resistor conducts, thereby lowering potential of said external terminal so that a resulting potential of the drain terminals of said PMOS transistor and said NMOS transistor does not exceed a voltage which would damage said PMOS transistor and said NMOS transistor, and the resulting potential is at least a threshold level of said input buffer; and a current control circuit for, when the potential of said external terminal is higher than the power supply potential, controlling a potential lowered by said resistor so the potential lowered by said resistor is equal to the power supply potential.

* * * * *